United States Patent
Gayden et al.

(10) Patent No.: US 11,621,411 B2
(45) Date of Patent: Apr. 4, 2023

(54) METHOD OF INSULATING LITHIUM ION ELECTROCHEMICAL CELL COMPONENTS WITH METAL OXIDE COATINGS

(71) Applicant: Intecells, Inc., Southfield, MI (US)

(72) Inventors: Xiaohong Gayden, West Bloomfield, MI (US); Joseph M. Ziegelbauer, Sterling Heights, MI (US); Lu Liu, Troy, MI (US)

(73) Assignee: INTECELLS, INC., Southfield, MI (US)

( * ) Notice: Subject to any disclaimer, the term of this patent is extended or adjusted under 35 U.S.C. 154(b) by 0 days.

(21) Appl. No.: 17/125,787

(22) Filed: Dec. 17, 2020

(65) Prior Publication Data

US 2021/0189556 A1 Jun. 24, 2021

Related U.S. Application Data

(60) Provisional application No. 62/952,731, filed on Dec. 23, 2019.

(51) Int. Cl.
| | |
|---|---|
| H01M 4/04 | (2006.01) |
| C23C 16/40 | (2006.01) |
| H01M 10/0525 | (2010.01) |
| H01M 50/403 | (2021.01) |
| H01M 50/434 | (2021.01) |
| H01M 50/449 | (2021.01) |
| H01M 4/62 | (2006.01) |
| H01M 4/139 | (2010.01) |
| C23C 16/04 | (2006.01) |
| C23C 16/513 | (2006.01) |
| H01M 4/66 | (2006.01) |

(52) U.S. Cl.
CPC ........... *H01M 4/0428* (2013.01); *C23C 16/04* (2013.01); *C23C 16/40* (2013.01); *C23C 16/513* (2013.01); *H01M 4/0404* (2013.01); *H01M 4/139* (2013.01); *H01M 4/62* (2013.01); *H01M 4/667* (2013.01); *H01M 10/0525* (2013.01); *H01M 50/403* (2021.01); *H01M 50/434* (2021.01); *H01M 50/449* (2021.01)

(58) Field of Classification Search
CPC .................................................. H01M 4/0421
See application file for complete search history.

(56) References Cited

U.S. PATENT DOCUMENTS

2011/0104568 A1 5/2011 Sung et al.
2012/0261391 A1 10/2012 Ihde et al.
(Continued)

FOREIGN PATENT DOCUMENTS

CN 108269957 7/2018
DE 102013103504 10/2014
(Continued)

*Primary Examiner* — Austin Murata
(74) *Attorney, Agent, or Firm* — Honigman LLP; Andrew N. Weber; Jonathan P. O'Brien

(57) ABSTRACT

Disclosed is a method for making a lithium-ion cell by depositing from an atmospheric plasma deposition device inorganic oxide particles produced from a precursor in an atmospheric plasma as a coating on a surface of a lithium-ion electrochemical cell component. The coating formed by (Continued)

the inorganic oxide particles may be an insulating coating or may provide dimensional stability during a thermal runaway.

9 Claims, 2 Drawing Sheets

(56) References Cited

U.S. PATENT DOCUMENTS

| | | |
|---|---|---|
| 2013/0143146 A1 | 6/2013 | Huang |
| 2014/0138802 A1* | 5/2014 | Starostine ........... H01L 51/0097 |
| | | 438/786 |
| 2015/0162596 A1 | 6/2015 | Dadheech et al. |
| 2015/0280219 A1 | 10/2015 | Xiao et al. |
| 2015/0349307 A1 | 12/2015 | Dadheech |
| 2016/0056455 A1 | 2/2016 | Shibusawa |
| 2016/0254533 A1 | 9/2016 | Gayden |
| 2017/0058389 A1 | 3/2017 | Gayden |
| 2017/0121807 A1 | 5/2017 | Deng et al. |
| 2017/0237074 A1 | 8/2017 | Lopatin et al. |
| 2017/0301958 A1* | 10/2017 | Deng ................ H01M 10/0404 |
| 2018/0019457 A1 | 1/2018 | Alharizah et al. |
| 2018/0212271 A1 | 7/2018 | Lu et al. |
| 2020/0020925 A1* | 1/2020 | Aya ......................... H01M 4/13 |

FOREIGN PATENT DOCUMENTS

| | | |
|---|---|---|
| DE | 112014006664 | 1/2017 |
| EP | 2806493 A | 11/2014 |
| EP | 2328214 | 8/2017 |
| JP | 200458426 | 2/2004 |
| JP | 2006-339184 | 12/2006 |
| JP | 20111107510 | 9/2011 |
| JP | 4897742 | 3/2012 |
| JP | 2015-146247 | 8/2015 |
| JP | 2018-125240 | 8/2018 |
| JP | 2020-512677 | 4/2020 |
| WO | 2003/075375 | 9/2003 |
| WO | 2007028798 | 3/2007 |
| WO | 2010081610 | 7/2010 |
| WO | 2011/019988 | 2/2011 |
| WO | 2012013286 | 2/2012 |
| WO | 2014/116522 | 7/2014 |
| WO | 2015/172278 | 11/2015 |
| WO | 2016082120 | 2/2016 |
| WO | 2018124992 | 7/2018 |
| WO | 2018182977 | 10/2018 |

* cited by examiner

METHOD OF INSULATING LITHIUM ION ELECTROCHEMICAL CELL COMPONENTS WITH METAL OXIDE COATINGS

CROSS REFERENCE TO RELATED APPLICATIONS

This application claims the benefit of U.S. Provisional Patent Application No. 62/952,731, filed Dec. 23, 2019, which is hereby incorporated by reference in its entirety.

TECHNICAL FIELD

This specification relates to methods of applying insulating coatings of metal oxide to lithium-ion cell components.

INTRODUCTION

This section provides information helpful in understanding the invention but that is not necessarily prior art.

A lithium ion electrochemical cell typically comprises a negative electrode layer (anode during cell discharge), a positive electrode layer (cathode during cell discharge), a thin, porous separator layer interposed in face-to-face contact between the parallel, facing, electrode layers, a liquid, lithium-containing electrolyte solution filling the pores of the separator and contacting the facing surfaces of the electrode layers for transport of lithium ions during repeated cell discharging and re-charging cycles, and thin layers of metallic current collector on the other, outer sides of the electrode layers.

Large format lithium ion batteries, such as those used in hybrid and plug-in electric vehicles, have a potential for battery fire resulting from thermal runaway, which can be caused by one or more of stress cracking due to electrode expansion and shrinkage during the lithiation/delithiation process, puncture, overcharge, overheating, compaction, and internal short circuit. An ideal separator prevents ion flow and continues to physically separate the positive and negative electrodes during thermal runaway. If the battery temperature gets high enough, the separator may melt and partially clog the pores to help prevent ion flow, but the separator can also shrink and thereby allow physical contact of the positive and negative electrodes, which would in turn accelerate thermal runaway.

One approach to maintaining the structural stability of the separator layer during thermal runaway is to coat the separator with a PVDF coating or ceramic coating, such as described in US Patent Application Publication 2018/0212271. The '271 application Publication describes application of the PVDF as a gel coating in which the polymer is dissolved in a mixture of volatile solvents. The '271 application Publication points out that the porous substrate made from the gel coating is easily oxidized when the battery is charged to a high voltage, which adversely affects mechanical strength of the separator. The '271 application Publication teaches a ceramic coating is provided by coating the surface of the separator with a slurry of ceramic particles in a solution of a water-soluble binder, e.g. sodium carboxylmethyl cellulose and SBR, PVA, or an acrylate binder, in water. As another example, US Patent Application 2018/0019457 describes the drawbacks of current binders for ceramic-coated separators and proposes a crosslinked binder. EP 2 806 493 describes the problem of reduced separator permeability caused by an applied inorganic oxide powder and proposes reducing the amount of clogging by using an inorganic oxide powder in which at least part of the particles have a shape with a specified high degree of irregularity. The EP 2 806 493 inorganic oxide powder is applied as a slurry in a polymer binder and solvent to form a coating layer from 1 to 50 micrometers thick; for example, the working example applies a coating 15 micrometers thick. EP2 806 493 takes note that its oxide purity may be as low as 90% by weight.

These previous methods, however, result in waste of materials during the slurry application step and apply the coating indiscriminately to an entire surface and demonstrate the difficulty of applying a sufficient amount of inorganic oxide for good insulation or to achieve dimensional stability without at the same time blocking pores of the separator or adding more weight than necessary or increasing layer thickness more than necessary in applying the inorganic oxide. Further, using solvents may introduce health and fire hazards and produce regulated emissions. In addition, the previous methods suggest no means of preventing electrical shorts from the current collectors. Therefore, there remains a need for a better method for applying insulating coatings or dimensionally stabilizing coatings to desired areas of one or more of the surfaces of a lithium ion cell or battery.

SUMMARY

The need for an improvement in methods of manufacturing lithium ion batteries to resist internal short circuits and separator failure during a thermal runaway event is met by the method now disclosed of depositing from an atmospheric plasma deposition device inorganic oxide particles produced in the atmospheric plasma from a precursor onto a surface of a lithium-ion electrochemical cell component and a lithium-ion electrochemical cell containing such a component made by atmospheric plasma deposition of inorganic oxide particles produced in the atmospheric plasma. In various embodiments, the surfaces onto which the inorganic oxide particles produced in the atmospheric plasma are applied by atmospheric plasma deposition comprise a metal surface of a current collector, an electrode surface of an electrode-coated current collector component, and/or a surface of a porous separator. The inorganic oxide particles can be deposited uniformly or nonuniformly over all of the surface or on a limited area less than the whole area of the surface, for example in a selected area or in selected areas or in a desired pattern. The deposited inorganic oxide particles may increase structural or dimensional stability of the substrate and/or provide or increase electrical insulation.

In various embodiments, the metal oxide may be a member selected from the group consisting of zirconium oxide, titanium oxide, aluminum oxide, cerium oxide, silicon oxides, and combinations of these produced in the atmospheric plasma from a suitable organometallic compound of the metal of the selected metal oxide or of each of the metals of the selected metal oxides.

In an embodiment, the method includes depositing from an atmospheric plasma deposition device inorganic oxide particles produced from a precursor in an atmospheric plasma onto a metal surface of a metal foil current collector, an electrode surface of an electrode-coated metal foil current collector component, and/or a surface of a porous separator, and incorporating the current collector, electrode-coated metal foil current collector component, and/or porous separator having the deposited inorganic oxide into a lithium-ion electrochemical cell. The inorganic oxide particles can be deposited uniformly or nonuniformly on the whole area or in a limited area less than the whole area of the surface and, if in a limited area, the limited area may be continuous or discontinuous regions. For example the inorganic oxide particles can be deposited in a pattern on the surface.

The disclosed methods advantageously minimize waste of material and provide better control of coating thickness and coating location in applying a metal oxide to a surface of a component for lithium ion batteries. The disclosed methods can be used to apply a thinner coating, for example less than 1 micrometer, compared to methods previously used. The disclosed methods produce coatings of very high purity metal oxide particles with advantageous gravimetric and volumetric energy densities in contrast to oxide powders produced by calcination, such as those used in the prior art slurry coatings described above in the Introduction. Additionally, the disclosed methods can be done in-line with lithium ion cell manufacture and assembly operations and can apply a metal oxide coating in a desired area on a metal surface of a current collector or on an electrode surface of an electrode-coated metal foil current collector component, which was previously unknown for the slurry and gel coating processes. Also advantageously, the disclosed methods do not require binder and do not use solvent, resulting in savings of material and energy costs and reduction in manufacturing steps. As a further advantage, in the methods now disclosed generate the metal oxide particles in the plasma of the atmospheric plasma deposition device to allow application of even very fine particles without the problems of producing and handling fine powders attendant with previously used methods.

BRIEF DESCRIPTION OF THE DRAWINGS

The embodiments can be better understood with reference to the following drawings and description. The components in the figures are not necessarily to scale, emphasis instead being place upon illustrating the principles of the embodiments. The drawings for illustrative purposes only of selected aspects and not all possible implementations, and are not intended to limit the scope of the present disclosure.

DETAILED DESCRIPTION

Definitions

Figure 1:
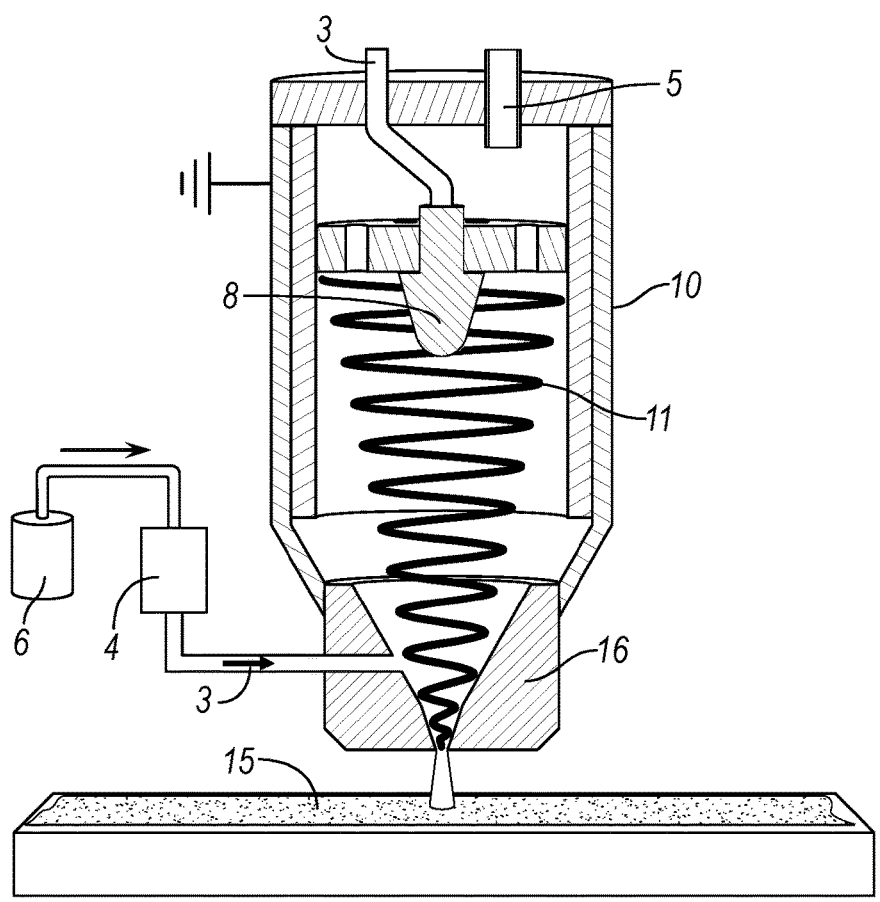
FIG. 1 is a schematic diagram of an atmospheric plasma deposition device for carrying out the method.

"A," "an," "the," "at least one," and "one or more" are used interchangeably to indicate that at least one of the item is present; a plurality of such items may be present unless the context clearly indicates otherwise. All numerical values of parameters (e.g., of quantities or conditions) in this specification, including the appended claims, are to be understood as being modified in all instances by the term "about" whether or not "about" actually appears before the numerical value. "About" indicates that the stated numerical value allows some slight imprecision (with some approach to exactness in the value; approximately or reasonably close to the value; nearly). If the imprecision provided by "about" is not otherwise understood in the art with this ordinary meaning, then "about" as used herein indicates at least variations that may arise from ordinary methods of measuring and using such parameters. In addition, disclosure of ranges includes disclosure of all values and further divided ranges within the entire range.

"Atmospheric plasma" refers to a plasma produced at a temperature up to about 3500° C. and a pressure at or about at atmospheric pressure. In an atmospheric plasma, the peak temperature reached by the metal oxide particles are typically less than about 1200° C.

The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. As used in this specification, the term "or" includes any and all combinations of one or more of the associated listed items.

A "limited area" means an area less than the whole area of the face of the substrate on which the metal oxide particles are deposited. The limited area may be a continuous region or a plurality of discontinuous regions on the face of the substrate. For a porous separator, the limited area may mean the face of the porous separator excluding at least part of the area of the pore openings on the surface of the separator.

"Particle size" refers to average particle size as determined by the ISO 13320 test method.

Each of the disclosed methods includes forming metal oxide particles from a precursor (or a plurality of precursors) in an atmospheric plasma of an atmospheric plasma deposition device and depositing the metal oxide particles by atmospheric plasma deposition onto a metal surface of a lithium-ion cell metal foil current collector, an electrode surface of an electrode-coated metal foil current collector component, and/or a surface of a porous separator. The area of the surface coated with the deposited metal oxide particles may be from about 0.5% of the surface area up to the whole area of the surface. In various embodiments, the metal oxide particle may applied by the atmospheric plasma deposition onto from about 0.5% or from about 1% or from about 2% or from about 3% or from about 4% or from about 5% or from about 7% or from about 10% or from about 15% or from about 20% or from about 25% or from about 30% up to about 50% or up to about 60% or up to about 70% or up to about 80% or up to about 90% or up to about 100% of the whole area of the surface. For example the metal oxide may be deposited by atmospheric plasma deposition onto from about 1% to about 100% or from about 2% to about 90% or from about 3% to about 70% or from about 4% to about 60% or from about 5% to about 50% or from about 5% to about 40% or from about 7% to about 40% of the whole area of the surface.

The metal oxide is an oxide of a member selected from the group consisting of silicon, titanium, zirconium, aluminum, cerium, and combinations of these. Nonlimiting examples of suitable metal oxides include zirconium oxide ($ZrO_2$), titanium dioxide ($TiO_2$), aluminum oxide ($Al_2O_3$), cerium oxide ($CeO_2$), and silicon oxides ($SiO_x$). Nonlimiting examples of suitable precursor compounds for zirconium oxide include zirconium acetate, ammonium zirconium carbonate solution, zirconium acetylacetonate, zirconium n-butoxide, zirconium (IV) sulfate tetrahydrate, and tetrakis(dimethylamido)zirconium(IV). Nonlimiting examples of suitable precursor compounds for cerium oxide include cerium chloride, cerium nitrate hydrate, and cerium sulfate hydrate. Nonlimiting examples of suitable precursor compounds for titanium dioxide include titanium (IV) butoxide, titanium (IV) isopropoxide, and titanium (IV) oxysulfate. Nonlimiting examples of suitable precursor compounds for aluminum oxide include aluminum chloride, aluminum nitrate hydrate, aluminum acetylacetonate, aluminum sulfate hydrate, dimethylaluminum isopropoxide, aluminum isopropoxide, tris(dimethylamido) aluminum, aluminum nitrate nonahydrate, and timethylaluminum. Nonlimiting examples of suitable precursor compounds for silicon oxides ($SiO_x$) include siloxane compounds such as tetraalkylsiloxanes like tetraethylsiloxane (TEOS) or a hexaalkyldisiloxanes such as hexamethyldisiloxane (HMDSO).

The precursor is introduced as a gas or vapor into the atmospheric plasma. A liquid precursor or solution of a solid precursor may be vaporized, e.g. in an evaporator, just before introduction into the plasma deposition device, the precursor forming a metal oxide in the atmospheric plasma.

A plasma nozzle typically has a metallic tubular housing which provides a flow path of suitable length for receiving the flow of the working gas and for enabling the formation of the plasma stream in an electromagnetic field established within the flow path of the tubular housing. The tubular housing typically terminates in a conically tapered outlet nozzle shaped to direct the metal oxide particle-carrying plasma stream toward a desired area of the surface. An oxygen source is provided, which may be, e.g., an oxygen-containing working gas such as air; an oxygen-containing gas or vapor, such as oxygen gas or water vapor, that is introduced separately from the working gas, for example as a carrier for the precursor compound; and/or oxygen atoms in the precursor compound itself. A linear (pin-like) electrode may be placed at the ceramic tube site along the flow axis of the nozzle at the upstream end of the tubular housing. During plasma generation the electrode is powered by a high frequency generator, for example at a frequency of about 50 to 60 kHz, and to a suitable potential such as 300 volts. The metallic housing of the plasma nozzle is grounded, and an electrical discharge can be generated between the axial pin electrode and the housing. When the generator voltage is applied, the frequency of the applied voltage and the dielectric properties of the ceramic tube produce a corona discharge at the stream inlet and the electrode. As a result of the corona discharge, an arc discharge from the electrode tip to the housing is formed. This arc discharge is carried by the turbulent flow of the working gas stream to the outlet of the nozzle. A reactive plasma of the air (or other working gas) is formed at a relatively low temperature and at atmospheric pressure. A precursor gas or vapor that forms the metal oxide particles is introduced into the plasma stream. The outlet of the plasma nozzle is shaped to direct the metal oxide particle-carrying plasma stream onto a desired area of the substrate. Movement of the plasma nozzle can be controlled by an algorithm of a central processing unit, and flow of precursor vapor into the plasma can also be controlled, such that the plasma deposition device deposits metal oxide coating of desired coating thickness(es) in the limited area.

Such an arrangement is shown in FIG. 1. Atmospheric plasma deposition device 1 includes electrode 8 located in plasma jet 10 and connected to a high voltage supply 3. Working gas feed 5 provides a working gas that forms an atmospheric plasma 11 due to the electromagnetic field resulting from high voltage electrode 8. Precursor supply 6 feeds a liquid precursor for the metal oxide to evaporator 4. The precursor is vaporized in evaporator 4. The precursor vapor is then fed via vapor line 3 to plasma nozzle 16 where the precursor vapor is oxidized to form metal oxide particles having an activated surface in the plasma 11 and which are then deposited from atmospheric plasma deposition device 1 in plasma 11 to form coating 15 on a lithium ion cell surface.

The metal oxide coating may be from about 10 nanometers to about 10 micrometers thick, or from about 30 nanometers to about 5 micrometers thick, or from about 40 nanometers to about 3 micrometer thick, or from about 50 nanometers to about 1 micrometer thick, or from about 60 nanometers to about 800 nanometers thick, or from about 70 nanometers to about 800 nanometers thick, or from about 70 nanometers to about 500 nanometers thick.

The metal oxide coating insulates up to about 100 volts (breakdown voltage under direct current), or up to about 80 volts, or up to about 50 volts, or up to about 30 volts, or up to about 5 volts.

The surface area coated by the metal oxide may be a continuous area (including the whole surface of the component) or a discontinuous area, and the metal oxide particles may be applied on a web of the substrate in a repeating pattern with a repeat frequency that corresponds to the size of the lithium ion cell components to be cut from the web. Example lithium ion cell components on whose surface the metal oxide can be coated by atmospheric plasma deposition include anode layers, cathode layers, current collectors (metal foils), and porous separator substrates. A metal oxide coating on a limited area may be selected to provide electrical insulation for a surface incorporated into the lithium ion cell, such as an insulated area on an anode layer, a cathode layer, or on a current collector. In this regard, a metal oxide coating may be selectively applied in areas on anode layers, cathode layers, and/or current collectors that may be susceptible to electrical shorts during operation of a lithium ion battery. Suitable metal foils include aluminum, copper, nickel, and stainless steel foils. For example, a cathode current collector may be an aluminum foil and an anode current collector may be a copper foil. The surface may be a bare metal and/or electrode surface of an electrode-coated metal foil current collector component. Suitable examples of active anode materials include, without limitation, lithium titanate (LTO), graphite, and silicon-based materials such as silicon, silicon alloys, $SiO_x$, and LiSi alloys. Suitable examples of active cathode materials include, without limitation, lithium manganese nickel cobalt oxide (NMC), lithium manganese oxide (LMO), lithium cobalt oxide (LCO), lithium nickel cobalt aluminum oxide (NCA), lithium iron phosphate (LFP), and other lithium-complementary metal(s) oxides and phosphates.

Figure 2:
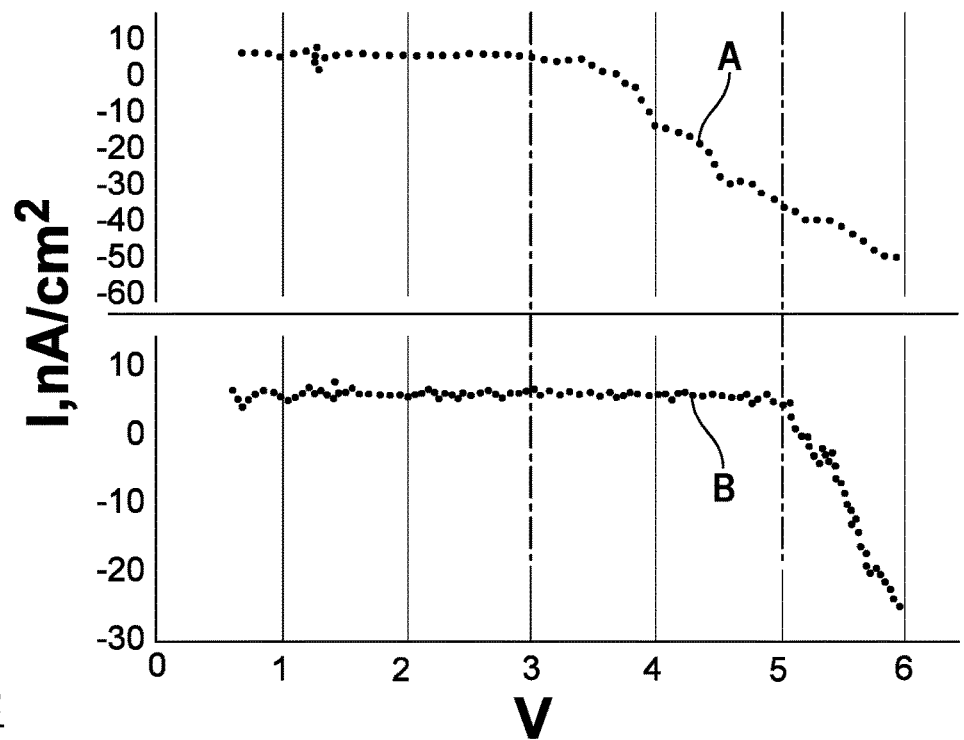
FIG. 2 is a graph comparing a substrate insulated by the method to a substrate without the insulating coating.

FIG. 2 shows the insulating effect of an aluminum oxide coating applied by atmospheric plasma deposition onto an aluminum current collector substrate. The graph of FIG. 2 shows the current density in $nA/cm^2$ versus voltage in a polarization test using a three-electrode working electrochemical cell. Line A shows that without an atmospheric plasma-deposited metal oxide coating the aluminum foil remains very conducive. Line B measures current flow through the aluminum foil having a 400 nm metal oxide layer coated by atmospheric plasma deposition. Line B shows excellent insulation by the metal oxide coating up to about 5 volts, the expected decomposition potential of the electrolyte.

In one embodiment, the lithium ion cell substrate is a porous separator substrate a metal oxide layer is applied by atmospheric plasma deposition on one or both faces of the porous separator substrate. Suitable porous separators have been made of polymers such as polyethylene, polypropylene, polyethylene oxide, polyvinylidene difluoride (PVDF), and ethylene-propylene copolymers, which may be filled with particulate ceramic material such as alumina ($Al_2O_3$), silica ($SiO_2$), magnesium oxide (MgO), or lithium-containing materials. The limited area may be selected to increase structural stability of a porous separator substrate for preventing battery fire resulting from thermal runaway when incorporated into a lithium ion cell, such as by coating the whole surface while avoiding appreciably reducing porosity of the porous separator.

Figure 3A:
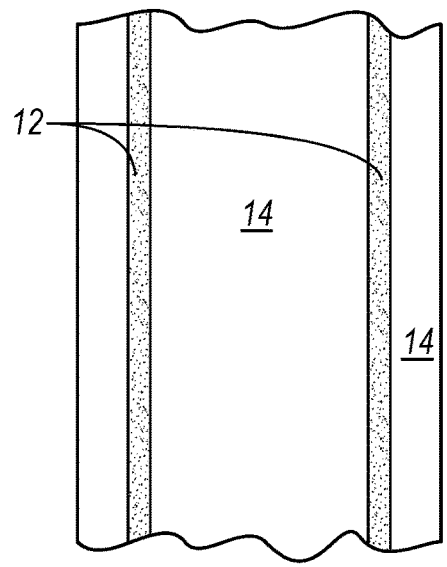
FIGS. 3A-3D illustrate various patterns for atmospheric plasma deposition of a metal oxide coating according to the method.
Figure 3B:
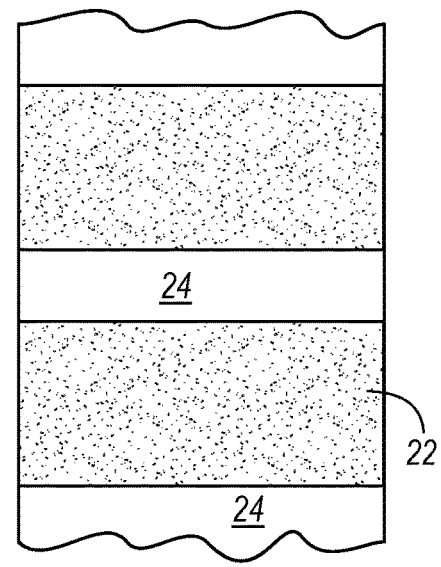
Figure 3C:
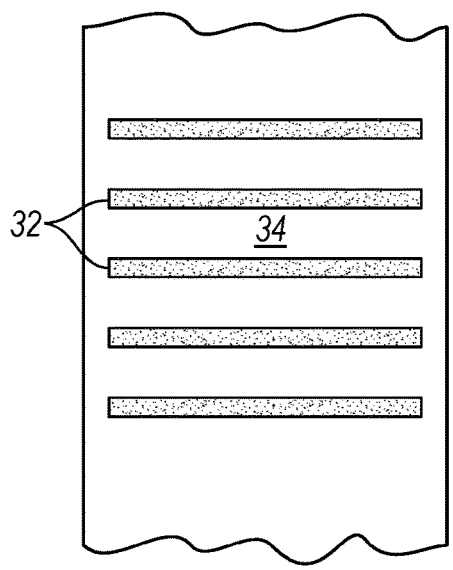
Figure 3D:
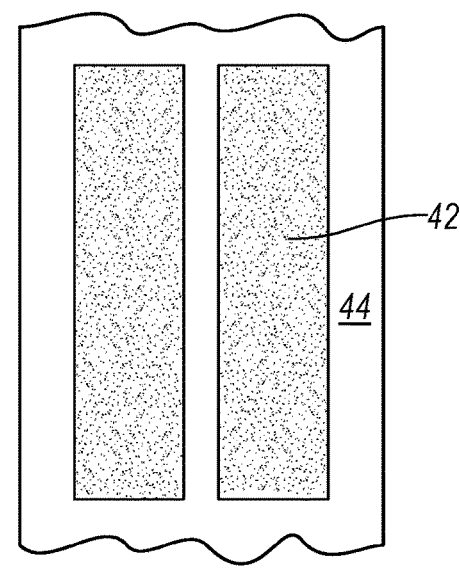

FIGS. 3A to 3D illustrate example embodiments in which a lithium ion cell substrate is provided with a partial coating of the metal oxide coating on at least one side. FIG. 3A shows strips of metal oxide coating areas 12 deposited by atmospheric plasma deposition near the edges of a surface 14, such as a surface of a metal foil current collector and/or a surface of an electrode coated on a metal foil current collector. The coating areas 12 provide insulation in areas that may be prone to electrical shorting in a lithium ion cell. FIG. 3B shows areas of metal oxide coating 22 deposited by atmospheric plasma deposition on a substrate 24, such as a separator substrate from which individual porous separators will be cut prior to being incorporated into lithium ion cells, generally covering selected porous separator areas. FIG. 3C shows thinner strips of metal oxide coating areas 32 deposited by atmospheric plasma deposition crosswise across a lithium ion electrochemical cell substrate 34. FIG. 3D shows metal oxide coated over anode or cathode area 42 on metal foil current collector 44, the metal oxide being deposited by atmospheric plasma deposition.

A battery is assembled for an application by combining a suitable number of individual cells in a combination of electrical parallel and series connections to satisfy voltage and current requirements for a specified electric motor. In a lithium-ion battery application for an electrically powered vehicle, the assembled battery may, for example, comprise up to thousands of individually packaged cells that are electrically interconnected to provide forty to four hundred volts and sufficient electrical power to an electrical traction motor to drive a vehicle. The direct current produced by the battery may be converted into an alternating current for more efficient motor operation. The separator is infiltrated with a suitable electrolyte for the lithium ion cell. The electrolyte for the lithium-ion cell is often a lithium salt dissolved in one or more organic liquid solvents. Examples of salts include lithium hexafluorophosphate ($LiPF_6$), lithium tetrafluoroborate ($LiBF_4$), lithium perchlorate ($LiClO_4$), lithium hexafluoroarsenate ($LiAsF_6$), and lithium trifluoroethanesulfonimide. Some examples of solvents that may be used to dissolve the electrolyte salt include ethylene carbonate, dimethyl carbonate, methyl ethyl carbonate, and propylene carbonate. There are other lithium salts that may be used and other solvents. But a combination of lithium salt and liquid solvent is selected for providing suitable mobility and transport of lithium ions in the operation of the cell. The electrolyte is carefully dispersed into and between closely spaced layers of the electrode elements and separator layers.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

What is claimed is:

1. A method for making a lithium-ion cell, comprising:
vaporizing a precursor to generate a precursor vapor;
supplying the precursor vapor to an atmospheric plasma deposition device; and
depositing from the atmospheric plasma deposition device inorganic metal oxide particles produced from the precursor vapor in an atmospheric plasma as an electrically insulating coating on a surface of a lithium-ion electrochemical cell component;
wherein the precursor is selected from zirconium acetate, ammonium zirconium carbonate solution, zirconium acetylacetonate, zirconium n-butoxide, zirconium (IV) sulfate tetrahydrate, tetrakis(dimethylamido)zirconium (IV), cerium chloride, cerium nitrate hydrate, cerium sulfate hydrate, titanium (IV) butoxide, titanium (IV) isopropoxide, and titanium (IV) oxysulfate, aluminum chloride, aluminum nitrate hydrate, aluminum acetylacetonate, aluminum sulfate hydrate, dimethylaluminum isopropoxide, aluminum isopropoxide, tris(dimethylamido) aluminum, aluminum nitrate nonahydrate, trimethylaluminum, tetraethylsiloxane and hexamethyldisiloxane; and
wherein the inorganic metal oxide particles comprise an oxide of a silicon, titanium, zirconium, aluminum, cerium, or combinations thereof.

2. A method according to claim 1, wherein the electrically insulating coating has a thickness of from about 10 nanometers to about 10 micrometers.

3. A method according to claim 1, wherein the electrically insulating coating has a thickness of from about 70 nanometers to about 800 nanometers.

4. A method according to claim 1, wherein the electrically insulating coating covers from about 0.5% to 100% of the area of the surface.

5. A method according to claim 1, wherein the electrically insulating coating forms a repeating pattern on the surface.

6. A method according to claim 1, wherein the lithium-ion electrochemical cell component is a porous separator and the electrically insulating coating provides dimensional stability.

7. A method according to claim 6, wherein the electrically insulating coating does not appreciably reduce porosity of the porous separator.

8. A method according to claim 1, wherein the lithium-ion electrochemical cell component is a current collector or an electrode-coated current collector component; and wherein the electrically insulating coating increases electrical insulation.

9. A method according to claim 8, wherein the electrically insulating coating insulates at least up to about 5 volts.

* * * * *